(12) United States Patent
Steiner et al.

(10) Patent No.: US 12,206,044 B2
(45) Date of Patent: Jan. 21, 2025

(54) SEMICONDUCTOR COMPONENT WITH A STRESS COMPENSATION LAYER AND A METHOD FOR MANUFACTURING A SEMICONDUCTOR COMPONENT

(71) Applicant: OSRAM OLED GMBH, Regensburg (DE)

(72) Inventors: André Steiner, Dresden (DE); Christine Rafael, Donaustauf (DE); Paola Altieri-Weimar, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 877 days.

(21) Appl. No.: 17/264,320

(22) PCT Filed: Jul. 31, 2019

(86) PCT No.: PCT/EP2019/070680
§ 371 (c)(1),
(2) Date: Jan. 29, 2021

(87) PCT Pub. No.: WO2020/025700
PCT Pub. Date: Feb. 6, 2020

(65) Prior Publication Data
US 2021/0328103 A1 Oct. 21, 2021

(30) Foreign Application Priority Data
Aug. 2, 2018 (DE) .................... 10 2018 118 824.2

(51) Int. Cl.
*H01L 33/12* (2010.01)
*H01L 33/62* (2010.01)
(Continued)

(52) U.S. Cl.
CPC .............. *H01L 33/12* (2013.01); *H01L 33/62* (2013.01); *H01S 5/2214* (2013.01); *H01S 5/3201* (2013.01); *H01S 2301/176* (2013.01)

(58) Field of Classification Search
CPC ... H01L 33/12; H01S 2301/176; H01S 5/3201
See application file for complete search history.

(56) References Cited

U.S. PATENT DOCUMENTS 8,941,218 B1   1/2015   Perkins et al.
8,969,109 B1   3/2015   Bedell et al.
(Continued)

FOREIGN PATENT DOCUMENTS

WO   2017029877 A1   2/2017

OTHER PUBLICATIONS

International Search Report issued for the PCT application No. PCT/EP2019/070680, dated Nov. 15, 2019, 6 pages (for informational purpose only).

(Continued)

*Primary Examiner* — Eric K Ashbahian
*Assistant Examiner* — Halee Cramer
(74) *Attorney, Agent, or Firm* — VIERING, JENTSCHURA & PARTNER mbB

(57) ABSTRACT

A semiconductor device may include a conductive layer over a semiconductor body and a first stress compensation layer adjacent to the conductive layer. The stress compensation layer may include a defined first stress.

12 Claims, 10 Drawing Sheets

(51) Int. Cl.
*H01S 5/22* (2006.01)
*H01S 5/32* (2006.01)

(56) References Cited

U.S. PATENT DOCUMENTS

| | | |
|---|---|---|
| 2004/0056269 A1 | 3/2004 | Chen |
| 2010/0051995 A1* | 3/2010 | Katsuno .............. H01L 33/10 |
| | | 257/E33.056 |
| 2012/0061823 A1 | 3/2012 | Wu et al. |
| 2014/0357064 A1* | 12/2014 | Fox .............. H01L 21/02507 |
| | | 438/485 |
| 2015/0048484 A1* | 2/2015 | Perkins ............ H01L 23/3192 |
| | | 257/615 |
| 2015/0194481 A1* | 7/2015 | Lai .................. H01L 29/7843 |
| | | 257/632 |
| 2016/0329468 A1 | 11/2016 | Akram et al. |
| 2017/0365982 A1 | 12/2017 | Bachmann |
| 2018/0226596 A1 | 8/2018 | Moriwaki et al. |
| 2018/0366418 A1* | 12/2018 | Hua .................. H01S 5/3201 |
| 2019/0056263 A1* | 2/2019 | Burger .................. G01S 17/04 |

OTHER PUBLICATIONS

Mescher, M. J. et al., "Stress Control in Sputtered Silicon Nitride Films", Materials Research Society Symposium Proceedings, 1997, pp. 239-244, vol. 472.
Buda, M. et al., "Stress-Induced Effects by the Anodic Oxide in Ridge Waveguide Laser Diodes", IEEE, Oct. 2000, 11 pages, IEEE Journal of Quantum Electronics, vol. 36, No. 10.
German Search Report issued for the DE application No. 10 2018 118 824.2, dated May 28, 2019, 8 pages (for informational purpose only).

* cited by examiner

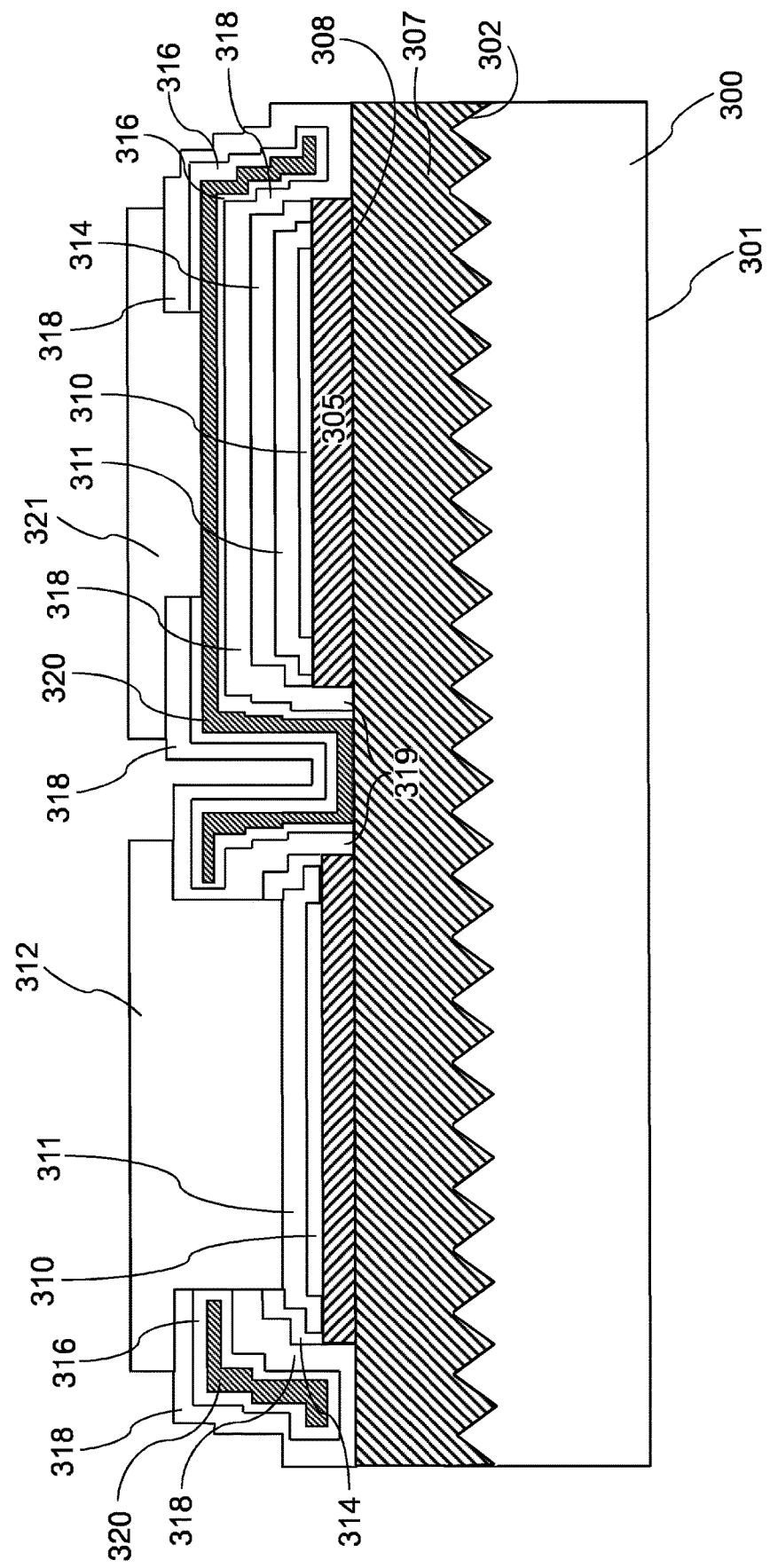

SEMICONDUCTOR COMPONENT WITH A STRESS COMPENSATION LAYER AND A METHOD FOR MANUFACTURING A SEMICONDUCTOR COMPONENT

CROSS-REFERENCE TO RELATED APPLICATIONS

The present application is a national stage entry according to 35 U.S.C. § 371 of PCT Application No.: PCT/EP2019/070680 filed on Jul. 31, 2019; which claims priority to German Patent Application Serial No.: 10 2018 118 824.2 filed on Aug. 2, 2018; all which are incorporated herein in their entirety by reference and for all purposes.

TECHNICAL FIELD

The aspects discussed in the present disclosure are related Semiconductor devices.

BACKGROUND

Semiconductor devices such as optoelectronic semiconductor devices may include passivation layers that electrically isolate components of the semiconductor device and also provide protection, for example, from environmental influences. An important reliability feature of a semiconductor device is the resistance of such a passivation layer, which also withstands further processing and the mechanical, thermal and electrical stresses that occur in this process.

SUMMARY

A semiconductor device may include a conductive layer over a semiconductor body, an insulating layer directly adjacent to the conductive layer, and a first stress compensation layer directly adjacent to the insulating layer. The stress compensation layer may include a defined first stress. For example, an absolute value of the stress may be greater than a predetermined limit value.

According to further aspects, a semiconductor device may include a conductive layer over a semiconductor body and a first stress compensation layer directly adjacent to the conductive layer. The stress compensation layer may include a defined first stress. For example, an absolute value of the stress may be greater than a predetermined limit value.

The first stress may be set by setting deposition parameters. For example, a compressive stress may be created by increasing the RF power and the pressure during the deposition. A tensile stress may be created by decreasing the pressure during the deposition and decreasing the RF power. In particular, when using a PECVD process for deposition, a stable stress may be achieved due to the high temperature that is present in this process (approx. 300° C.)

For example, the first stress may be adapted to a stress in a layer lying between the stress compensation layer and the semiconductor body. "Adapted" in this context means that the sign of the stress may be the same. Furthermore, the size of the stress may include a of a similar order of magnitude, i.e. it may include the same or a comparable power of ten. If this layer includes a tensile stress, for example, then the first stress may also be a tensile stress. If this layer includes a compressive stress, then the first stress may also be a compressive stress. The layer lying between the stress compensation layer and the semiconductor body may be an insulating or conductive layer.

For example, the first stress compensation layer may include silicon oxide or may include silicon oxide. The first stress may be a compressive stress. The semiconductor device may further include a second stress compensation layer with a defined second stress, which may be arranged over the first stress compensation layer.

The semiconductor device may, in addition, include a third stress compensation layer with a defined third stress, which may be arranged over the second stress compensation layer.

According to aspects, the first stress may be a tensile stress. The second stress may be a compressive stress or a tensile stress. The third stress may be a compressive stress.

Overall, when a second stress compensation layer is present, the first stress in the first stress compensation layer may be selected according to the stress in the adjacent insulating or conductive layer. If the adjacent insulating or conductive layer includes a compressive stress, then the first stress compensation layer may also include a compressive stress. If the adjacent insulating or conductive layer includes a tensile stress, then the first stress compensation layer may also include a tensile stress. The second stress compensation layer may include a stress opposite to the first stress.

The semiconductor device may, in addition, include a first stress-relieving layer between the first and the second stress compensation layers. For a stress-relieving layer, an absolute value of the stress may be less than a predetermined limit value. The semiconductor device may further include a second stress-relieving layer between the second and third stress compensation layers, in which an absolute value of stress may be less than the predetermined limit value.

For example, the semiconductor body may include a semiconductor chip, and the conductive layer may be suitable for connecting components of the semiconductor chip to an electrical terminal. The semiconductor device may further include a carrier element, in which the semiconductor chip may be mounted on the carrier element via the conductive layer.

For example, the semiconductor chip may include a light emitting diode (LED) chip that includes a first semiconductor layer of a first conductivity type and a second semiconductor layer of a second conductivity type. For example, the conductive layer may be electrically connected to the first or second semiconductor layer. The insulating layer and the stress compensation layer may include components of a passivation layer stack.

For example, the LED chip may be suitable for emitting electromagnetic radiation via a first main surface of the LED chip. Terminals for contacting the first and the second semiconductor layers may be arranged on a second main surface of the LED chip.

According to further aspects, the semiconductor chip may include a laser chip that includes a first semiconductor layer of a first conductivity type and a second semiconductor layer of a second conductivity type. The conductive layer may be electrically connected to the first semiconductor layer. The insulating layer and the stress compensation layers may be arranged between the conductive layer and the first semiconductor layer.

A method for manufacturing a semiconductor device may include forming a conductive layer, forming an insulating layer directly adjacent to the conductive layer, and forming a first stress compensation layer, which may include a defined first stress, over the insulating layer.

For example, the first stress may be set by setting the deposition parameters.

The method may further include forming a first stress-relieving layer directly adjacent to the first stress compensation layer, with an absolute value of stress in the first stress-relieving layer being less than a predetermined limit value, and forming a second stress compensation layer with a defined second stress directly adjacent to the first stress-relieving layer.

The method may further include forming a second stress-relieving layer directly adjacent to the second stress compensation layer, with an absolute value of the stress in the second stress-relieving layer being less than a predetermined limit value.

BRIEF DESCRIPTION OF THE DRAWINGS

The accompanying drawings serve to provide an understanding of exemplary aspects of the invention. The drawings illustrate exemplary aspects and, together with the description, serve to explain them. Further exemplary aspects and numerous of the intended advantages emerge directly from the following detailed description. The elements and structures illustrated in the drawings are not necessarily illustrated true to scale. Identical reference numerals refer to identical or corresponding elements and structures.

FIG. 3A illustrates a cross-sectional view through portions of an optoelectronic semiconductor device according to aspects.

DETAILED DESCRIPTION

Figure 1A:
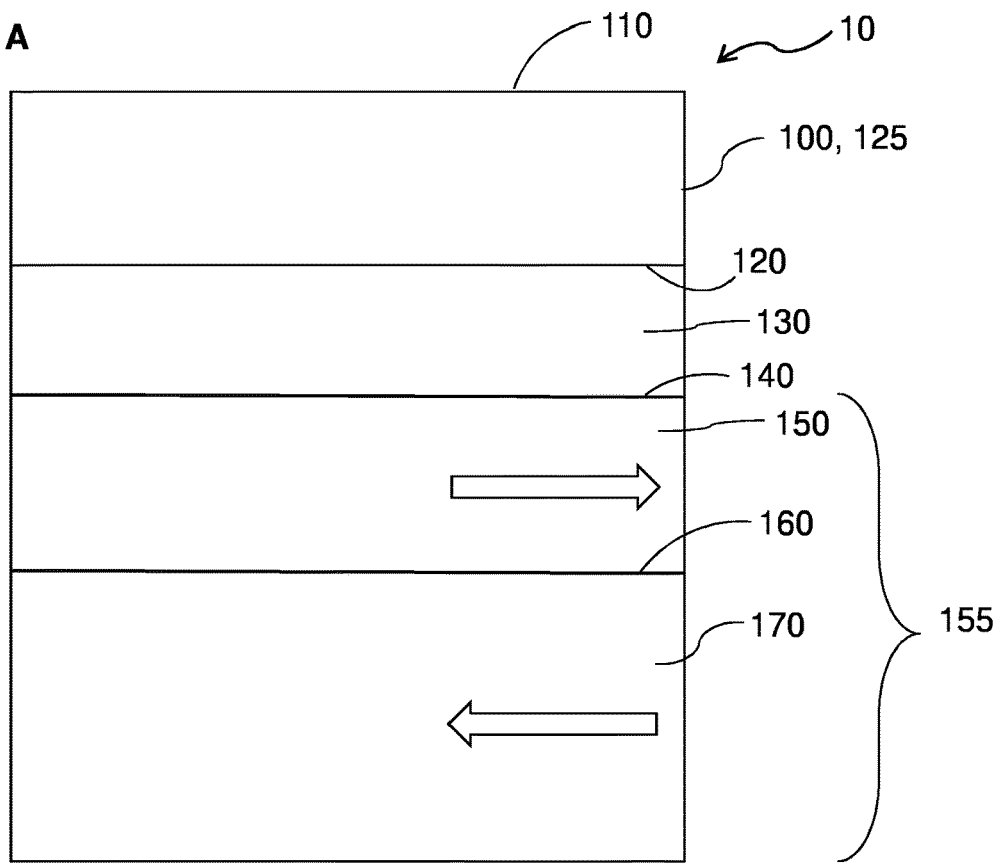
FIG. 1A illustrates a cross-sectional view through portions of a semiconductor device according to aspects.

In the following detailed description, reference is made to the accompanying drawings, which form part of the disclosure, and in which specific exemplary aspects are illustrated for purposes of illustration. In this context, directional terminology such as "top", "bottom", "front", "back", "over", "on", "in front of", "behind", "leading", "trailing", etc. refers to the orientation of the figures just described. Since the components of the exemplary aspects may be positioned in different orientations, the directional terminology is only used for explanation and is not restrictive in any way.

The description of the exemplary aspects is not restrictive, since also other exemplary aspects exist and structural or logical changes may be made without deviating from the scope defined by the claims. In particular, elements of exemplary aspects described in the following text may be combined with elements of other exemplary aspects described, unless the context indicates otherwise.

The terms "wafer" and "semiconductor substrate" used in the following description may include any semiconductor-based structure that includes a semiconductor surface. The wafer and structure are to be understood to include doped and undoped semiconductors, epitaxial semiconductor layers, possibly supported by a base, and further semiconductor structures. For example, a layer made of a first semiconductor material may be grown on a growth substrate made of a second semiconductor material or of an insulating material, for example, sapphire. Depending on the intended use, the semiconductor may be based on a direct or an indirect semiconductor material. Examples of semiconductor materials particularly suited for generating electromagnetic radiation may include, in particular, nitride semiconductor compounds which may, for example, generate ultraviolet, blue or longer-wave light such as GaN, InGaN, AlN, AlGaN, AlGaInN, phosphide semiconductor compounds, which may, for example, generate green or longer-wave light such as GaAsP, AlGaInP, GaP, AlGaP, as well as other semiconductor materials such as AlGaAs, SiC, ZnSe, GaAs, ZnO, $Ga_2O_3$, diamond, hexagonal BN, and combinations of the materials mentioned. The stoichiometric ratio of the ternary compounds may vary. Further examples of semiconductor materials may include silicon, silicon germanium, and germanium. In the context of the present description, the term "semiconductor" also includes organic semiconductor materials.

The term "substrate" generally includes insulating, conductive or semiconductor substrates.

The terms "lateral" and "horizontal", as used in this description, are intended to describe an orientation or alignment which runs essentially parallel to a first surface of a substrate or semiconductor body. This may, for example, be the surface of a wafer or a die or a chip.

The horizontal direction may, for example, lie in a plane perpendicular to a direction of growth when layers are grown on.

The term "vertical", as used in this description, is intended to describe an orientation which is essentially perpendicular to the first surface of the substrate or semiconductor body.

The vertical direction may, for example, correspond to a direction of growth when layers are grown on.

To the extent that the terms "have", "contain", "comprise", "include" and the like are used herein, they are open-ended terms that indicate the presence of said elements or features, but do not rule out the presence of other elements or features. The indefinite articles and the definite articles include both the plural and the singular, unless the context clearly indicates otherwise.

In the context of this description, the term "electrically connected" means a low-ohmic electrical connection between the connected elements. The electrically connected elements need not necessarily be directly connected to one another. Additional elements may be arranged between electrically connected elements. The term "electrically connected" also includes tunnel contacts between the connected elements.

In the context of the present description, layers are, in particular, described which include a stress, for example, a tensile or compressive stress. In general, stress may be positive or negative, i.e. a tensile or compressive stress. Within the scope of the present description, stress denotes a stress that leads to a deformation of a suitable substrate material, for example, a test wafer, if a corresponding layer is applied to the substrate material. In the case of a tensile stress, the substrate material with the applied layer may take on a bowl-like or concave shape. In the case of a compressive stress, the substrate material with the applied layer may take on a convex shape.

In the context of the present description, the term "defined stress" denotes a stress that is intentionally introduced and the absolute value of which is greater than a predetermined limit value. For example, a defined stress may be purposefully set by setting deposition parameters.

For example, the stress may be measured by measuring the wafer deflection on a test wafer. At a pressure in a range from −25 MPa to +25 MPa, the wafer may be free of stress. If the stress is greater than 25 MPa, one speaks of a tensile stress, and if the stress is less than −25 MPa, one speaks of a compressive stress. Correspondingly, a stress compensation layer with a tensile stress on a test wafer may lead to a stress of more than 25 MPa. A stress compensation layer with a compressive stress may lead to a stress of less than −25 MPa on a test wafer. A stress-relieving layer may lead to a stress between −25 MPa and +25 MPa on a test wafer.

The present invention may be based on the object of providing an improved semiconductor device, as well as an improved method for manufacturing a semiconductor device.

According to the present invention, the object may be achieved by the subject matter or the method of the independent claims.

FIG. 1A illustrates a cross-sectional view through portions of a semiconductor device 10. A conductive layer 130 may be arranged over a semiconductor body 100. The conductive layer may, for example, be a metallic layer, for example, a layer that may include Ni, Zn, Al, Ti, W or other metals that are typically used for metallizations in semiconductor devices. The semiconductor body 100, 125 may, for example, be any semiconductor body, for example, a semiconductor substrate with semiconductor layers deposited or applied thereon. The layers do not necessarily include monocrystalline, they may also be amorphous or polycrystalline. The semiconductor body 100, 125 may also include semiconductor layers without a semiconductor substrate or another substrate. Further non-semiconductor layers may be included in the semiconductor body, for example, insulating or conductive layers.

The semiconductor body 100 may, in particular, be a semiconductor chip 125, in which special functional components such as active or passive components, electronic or optoelectronic devices may be included. Examples include, amongst others, switching devices, power semiconductor devices, light-receiving devices, for example, sensors or solar cells, and light-emitting devices such as LEDs or lasers.

The conductive layer may be formed over a second main surface 120 of the semiconductor body 100, 125 and, for example, be in direct contact with the second main surface. In accordance with further aspects, further intermediate layers may also be arranged between the second main surface of the semiconductor body and the conductive layer. An insulating layer 150 adjoins the conductive layer 130. The insulating layer may, in particular, form part of a passivation layer or of a passivation layer stack. In addition to its insulating property, such a passivation layer serves as a diffusion barrier against gases, for example, corrosive gases such as water vapor. Examples of the insulating layer include silicon nitride, aluminum oxide, niobium oxide and silicon oxynitride. For example, the insulating layer may be chemically inert and may cause the passivation layer to adhere to the conductive layer. For example, the insulating layer may include a tensile stress. This may, for example, be the result of the manufacturing process of the insulating layer over the conductive layer.

A first stress compensation layer 170 may be arranged directly adjacent to a first main surface 160 of the insulating layer 150. The first stress compensation layer 170 may include a defined first stress. For example, the first stress compensation layer 170 may be a silicon oxide layer. For example, the silicon oxide layer may be TEOS-based, i.e. grown on by a deposition process, for example, a PECVD process ("plasma enhanced chemical vapor deposition") using TEOS (tetraethyl orthosilicate).

The first stress may, for example, include a compressive stress. For example, a compressive stress in the first stress compensation layer 170 may compensate for a tensile stress that prevails in an uncontrolled manner in the insulating layer 150 as a result of the manufacture.

In some aspects, the designation "over" may refer, in connection with applied layers, to a distance from a reference layer. If, for example, a stress compensation layer stack is described, then the feature that a first layer is arranged "over" a second layer may mean that the first layer is at a greater distance from the conductive layer 130 of the semiconductor device than the second layer. Accordingly, the term "over" may not be appropriate to describe a deposition sequence.

For example, according to aspects, the insulating layer 150 and the first stress compensation layer 170 may be arranged between the semiconductor body 100, 125 and the conductive layer 130.

Figure 1B:
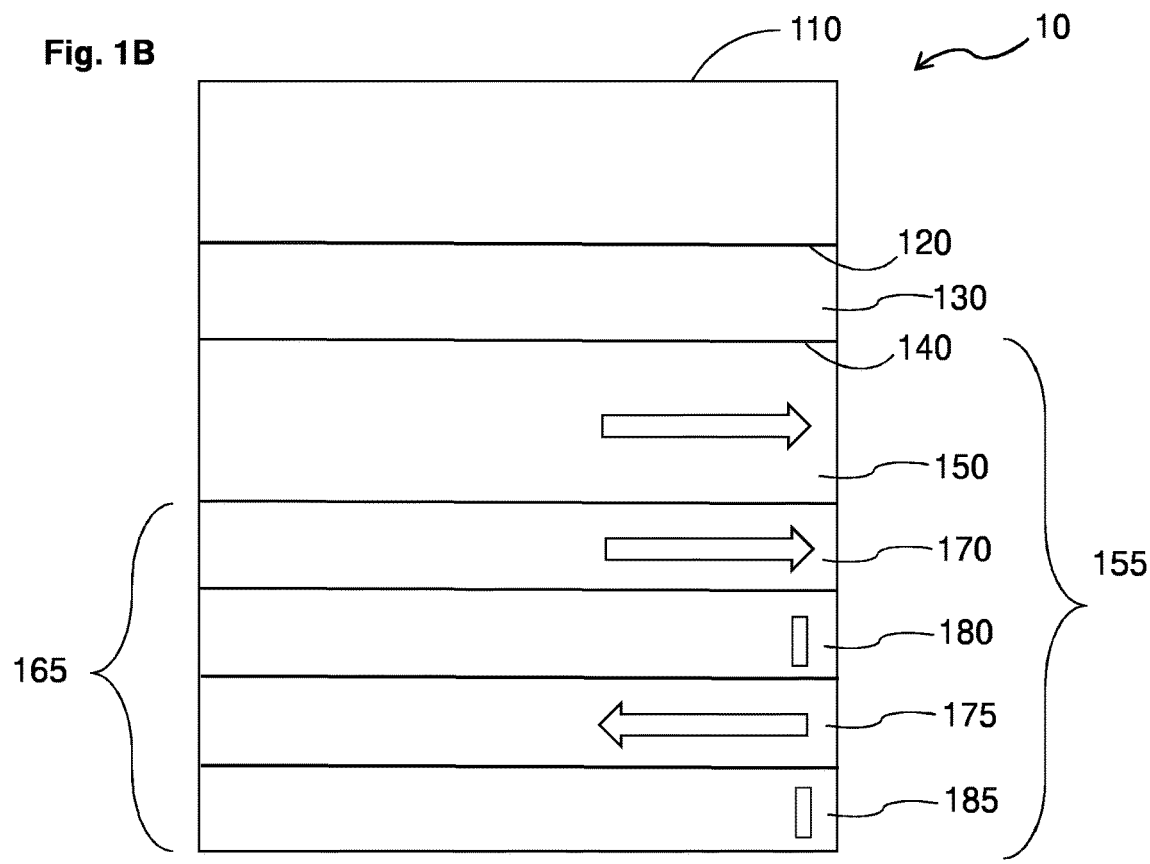
FIG. 1B illustrates a cross-sectional view through portions of a semiconductor device according to further aspects.

FIG. 1B illustrates a cross section through a portion of a semiconductor device according to further aspects. In this figure, deviating from the semiconductor device in FIG. 1A, the first stress in the first stress compensation layer 170 may include a tensile stress. Furthermore, the semiconductor device 10 or the stress compensation layer stack 165 may additionally include a second stress compensation layer 175, which may be arranged over the first stress compensation layer 170.

According to aspects, the second stress compensation layer 175 may be pressure-stressed. The stress in the second stress compensation layer 175 may thus be opposite to the stress in the first stress compensation layer 170. The second stress compensation layer 175 may directly adjoin the first stress compensation layer 170. According to further aspects, a first stress-relieving layer 180 may be arranged between the first and the second stress compensation layers 170, 175. The stress-relieving layer may be a layer in which an absolute value of stress is less than a predetermined limit value. For example, this limit value may be 25 MPa. The compensation layer stack may further include a second stress-relieving layer 185, which may be arranged over the second stress compensation layer 175. The presence of the stress-relieving layer 180 between the first and the second stress compensation layers 170, 175 may enable the stability of the compensation layer stack 165 to be increased further.

Due to the fact that the first stress compensation layer 170 may include the same type of stress as the insulating layer 150, mechanical and thermal stresses that occur may be compensated for particularly gently, so that the combination of compensation layer stack and insulating layer may be stable and the semiconductor device may therefore be particularly reliable.

According to the aspects, the stress compensation layer and, if applicable, the stress-relieving layers may each include silicon oxide or include silicon oxide, for example, silicon oxide which is TEOS-based. Further examples of materials may include silicon nitride, aluminum oxide or zirconium oxide. For example, aluminum oxide or zirconium oxide may be applied using ALD processes. The stress compensation layers may include a defined stress. The stress compensation layers and stress-relieving layers may form a stress compensation layer stack 165. The combination of stress compensation layer stack 165 and insulating layer 150 together may form a passivation layer stack 155 which may be suitable for mechanically, electrically and chemically protecting the underlying semiconductor device or the adjacent conductive layer. For example, the passivation layer stack 155 may form a diffusion barrier against corrosive gases such as water vapor.

Figure 1C:
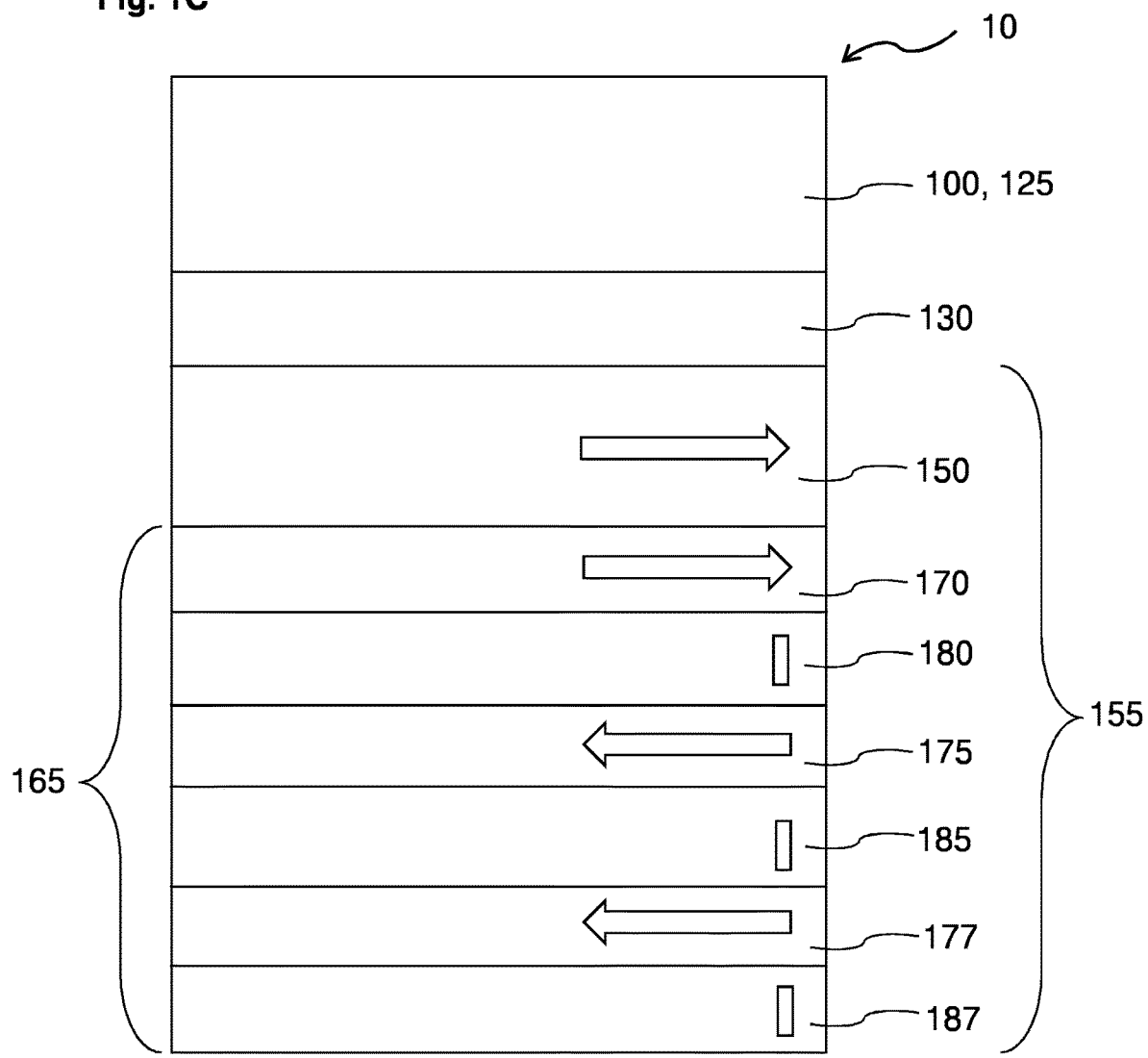
FIG. 1C illustrates a cross-sectional view through a portion of a semiconductor device according to further aspects.

FIG. 1C illustrates a cross-sectional view of a portion of a semiconductor device according to further aspects. In addition to the layers illustrated in FIG. 1B, the stress compensation layer stack 165 may further include a third stress compensation layer 177, which may be arranged over the second stress-relieving layer 185. The third stress compensation layer 177 may include, for example, a stress with the same sign as the second stress compensation layer 175. The third stress compensation layer may be pressure-stressed. Furthermore, the stress compensation layer stack 165 may additionally include a stress-relieving layer 187, which may be arranged over the third stress compensation layer 177.

Figure 1D:
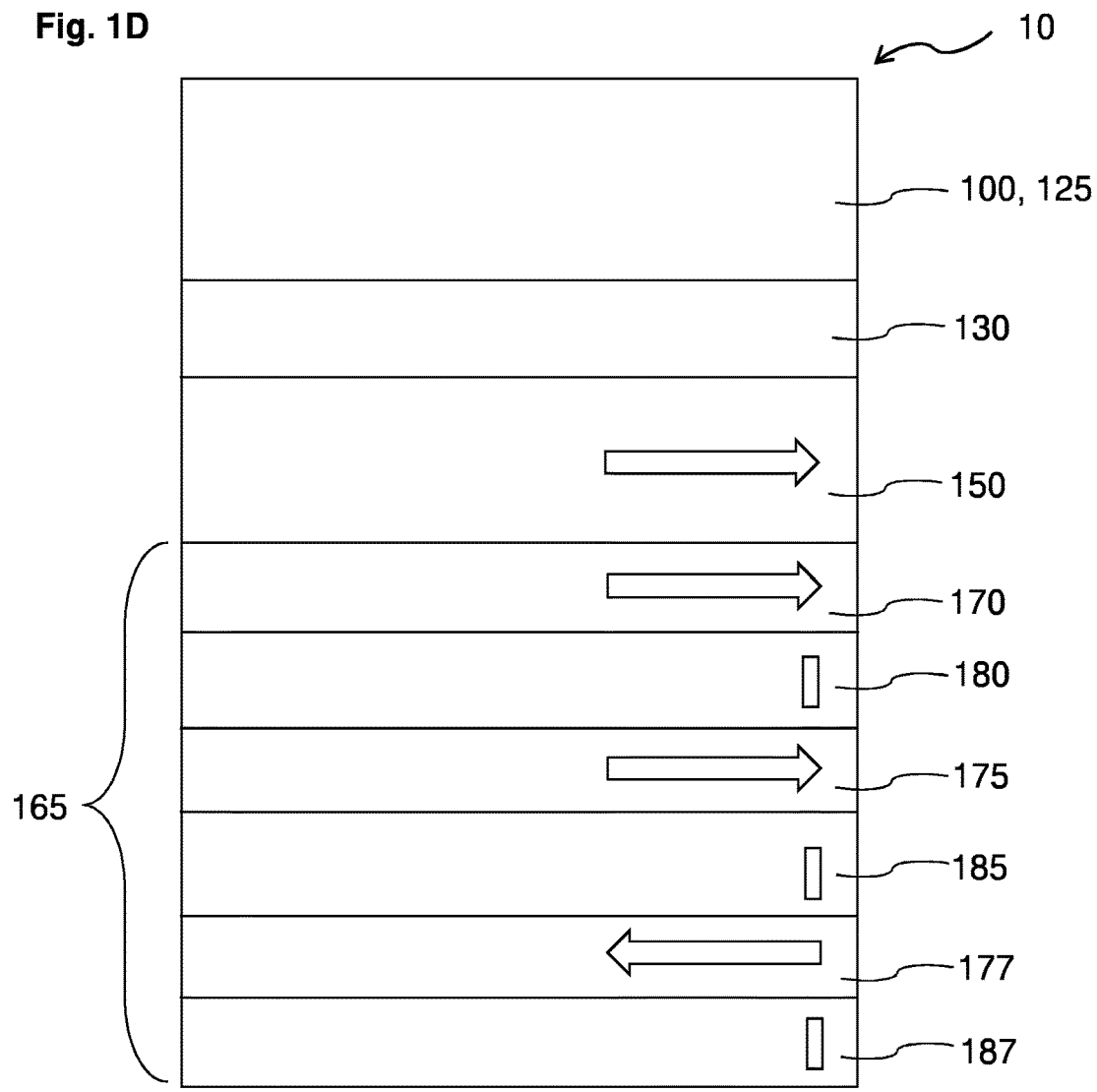
FIG. 1D illustrates a cross-sectional view through portions of a semiconductor device according to further aspects.

FIG. 1D illustrates a portion of a semiconductor device according to further aspects. In this figure, deviating from the semiconductor device in FIG. 1C, the stress in the second stress compensation layer 175 may include a tensile stress.

Figure 1E:
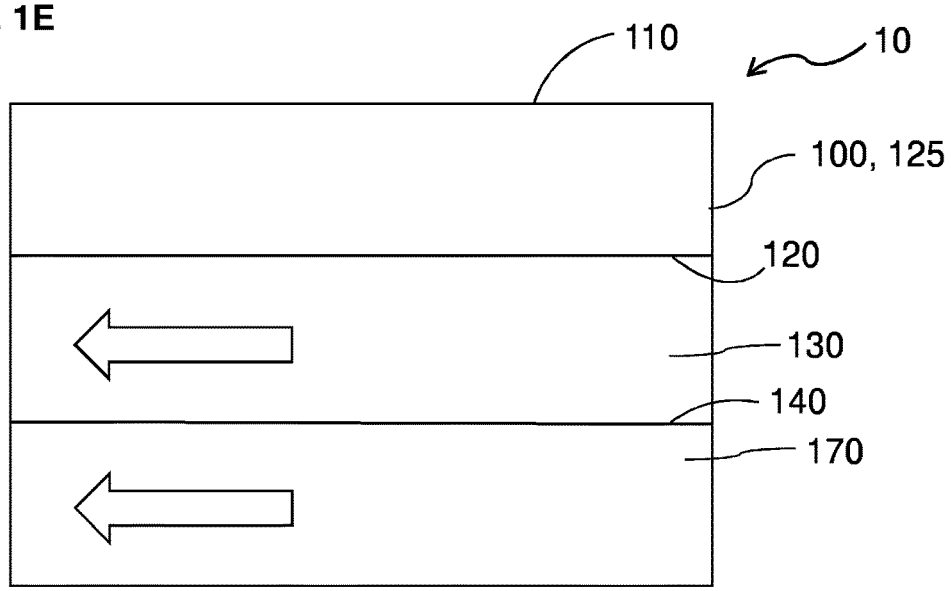
FIG. 1E illustrates a cross-sectional view through portions of a semiconductor device according to further aspects.

FIG. 1E illustrates a portion of a semiconductor device according to further aspects. In this figure, deviating from the aspects illustrated in FIG. 1A, the insulating layer 150 may be omitted, and the first stress compensation layer 170 may directly adjoin the conductive layer 130. The other components of the device may be as described with reference to FIG. 1A. For example, the first stress compensation layer 170 may include the same type of stress as the adjacent conductive layer. If the conductive layer 130 is pressure-stressed, then also the first stress compensation layer 170 may be pressure-stressed. If the conductive layer 130 is tension-stressed, then also the first stress compensation layer 170 may be tension-stressed. According to further aspects, further stress compensation layers and, if applicable, stress-relieving layers, as described with reference to FIGS. 1B to 1D, may be arranged over the first stress compensation layer 170.

In the described aspects, a total layer thickness of the stress compensation layer may be slightly more than 500 nm, for example, 500 to 1000 nm. A layer thickness of the individual layers may be approximately 120 to 200 nm, for example, 150 to 180 nm. The insulating layer 150 may, for example, include a layer thickness of more than 200 nm, for example, more than 300 nm, for example, 300 to 400 nm. For example, a layer thickness of the insulating layer may be less than 1000 nm.

Overall, it may be favorable to arrange a likewise tension-stressed first stress compensation layer 170 adjacent to a tension-stressed insulating layer 150. In this way, the pressure within the stress compensation layer stack 165 may adapt to the tensile stress in the adjacent insulating layer 150. Furthermore, when the stress-relieving layers 180, 185, 187 are used, a greater stability of the applied layer stack may be achieved and thus the reliability of the semiconductor device may be increased.

As a result of the differently stressed layers of the stress compensation layer stack 165, the passivation layer stack 155 may compensate for thermal and mechanical stresses with different signs (expansion, contraction). Such thermal and mechanical stresses may, in particular, occur if, for example, soldering processes are carried out on the semiconductor device. More precisely, the increase in temperature that coincides with a soldering process may lead to the creation of stresses within the semiconductor device. Due to the fact that the stress compensation layer stack is structured in the manner described, the stress on the chip may be reduced, as a result of which the reliability of the semiconductor device may be improved. The robustness against mechanical stresses may be increased in a similar way.

For example, a semiconductor device 10 with the stress compensation layer stack 165 described, as it is, for example, illustrated in FIGS. 1A to 1D, may further include a carrier element 205. The carrier element may be applied to one side of an insulating layer stack 221, 226 of the semiconductor chip. The insulating layer stack 221, 226 may include the stress compensation layer stack 165.

Figure 2A:
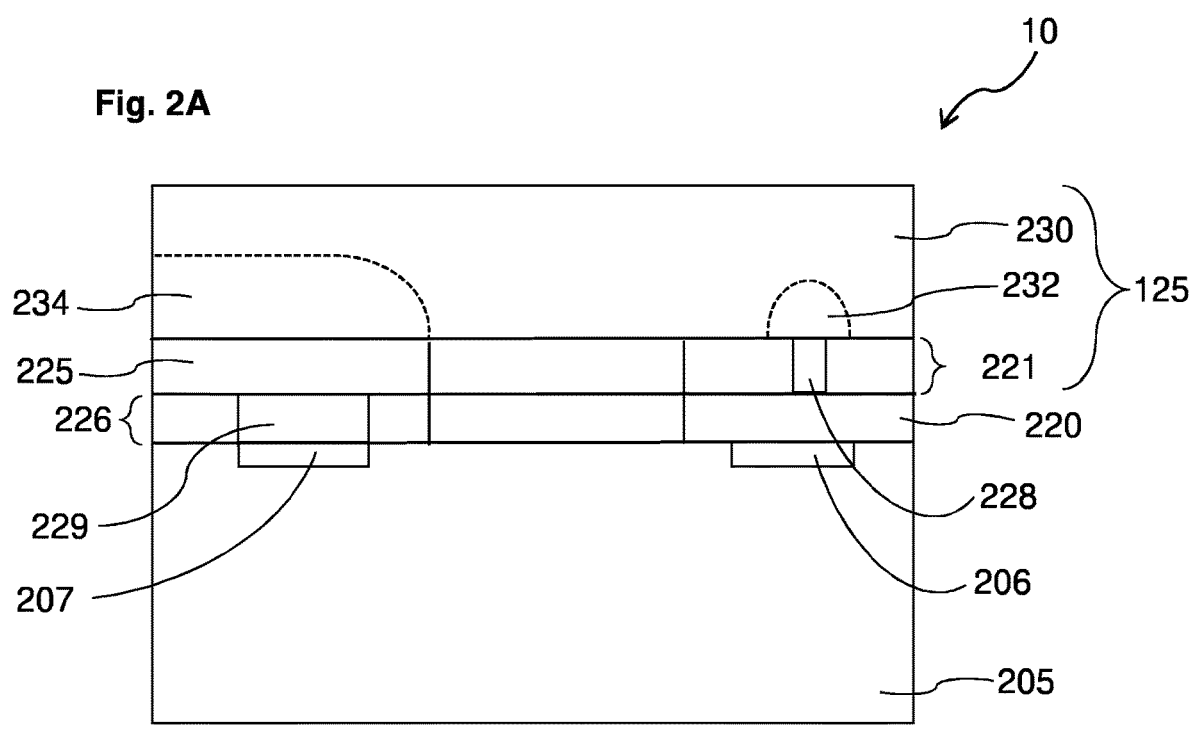
FIG. 2A illustrates a cross-sectional view through portions of a semiconductor device when arranged on a carrier element.

FIG. 2A illustrates a schematic cross-sectional view of a semiconductor chip 125 with a carrier element 205 applied. The semiconductor device illustrated in FIG. 2A may include a semiconductor chip, for example, with a semiconductor substrate 230. Various components of the semiconductor device, for example, conductive lines, doped areas, active, passive components, resistance elements, transistors, etc., may be formed within the semiconductor chip 125. The semiconductor chip 125 may include, for example, a first contact pad 220, which may be connected to a first component 232 of the semiconductor chip 125 via a contact material 228. The first contact pad 220 may be connected to a first contact area 206 of the carrier element 205. In addition, the semiconductor chip 125 may include a second contact pad 225 which, for example, may be connected to a second contact area 207 of a carrier element 205 via a contact material 229. The second contact pad 225 may be, for example, connected to a second component of the semiconductor chip 125.

For example, a first insulating layer stack 221 may be arranged between the semiconductor substrate 230 and the first contact pad 220. The first insulating layer stack 221 may include an insulating layer 150, as discussed above, as well as the stress compensation layer stack 165. For example, the first insulating layer stack 221 may cause passivation of the semiconductor substrate with the components arranged therein.

Furthermore, a second insulating layer stack 226 may be arranged between the second contact pad 225 and the carrier element 205. The described compensation layer stack 165, which are described with reference to FIGS. 1A to 1D and forms part of the insulating layer stack 221, may therefore be arranged both between the semiconductor substrate and the metallic layer. According to further aspects, the described compensation layer stack 165 may also be arranged between the metallic layer and an adjacent carrier element.

The carrier element 205 may, for example, likewise be a semiconductor substrate, for example, with semiconductor devices arranged therein. According to further aspects, however, it may also include a printed circuit board onto which the semiconductor substrate 230 with the components included therein may be soldered. If the semiconductor substrate 230 with the components formed therein is brought into contact with the carrier element 205 and subsequently heated, a strong thermal and associated mechanical stress may occur within the semiconductor device. Due to the fact that the semiconductor device 10 may include stress compensation layers as described, these stresses may be compensated for.

The semiconductor device 10 illustrated in FIG. 2A may include any semiconductor device which, for example, represents a switching device, for example, for logic applications or an optoelectronic device, for example, a solar cell. For example, the semiconductor device 10 may not include an outer housing, but rather it may be designed in such a manner that it is soldered directly onto the carrier element 205.

Figure 2B:
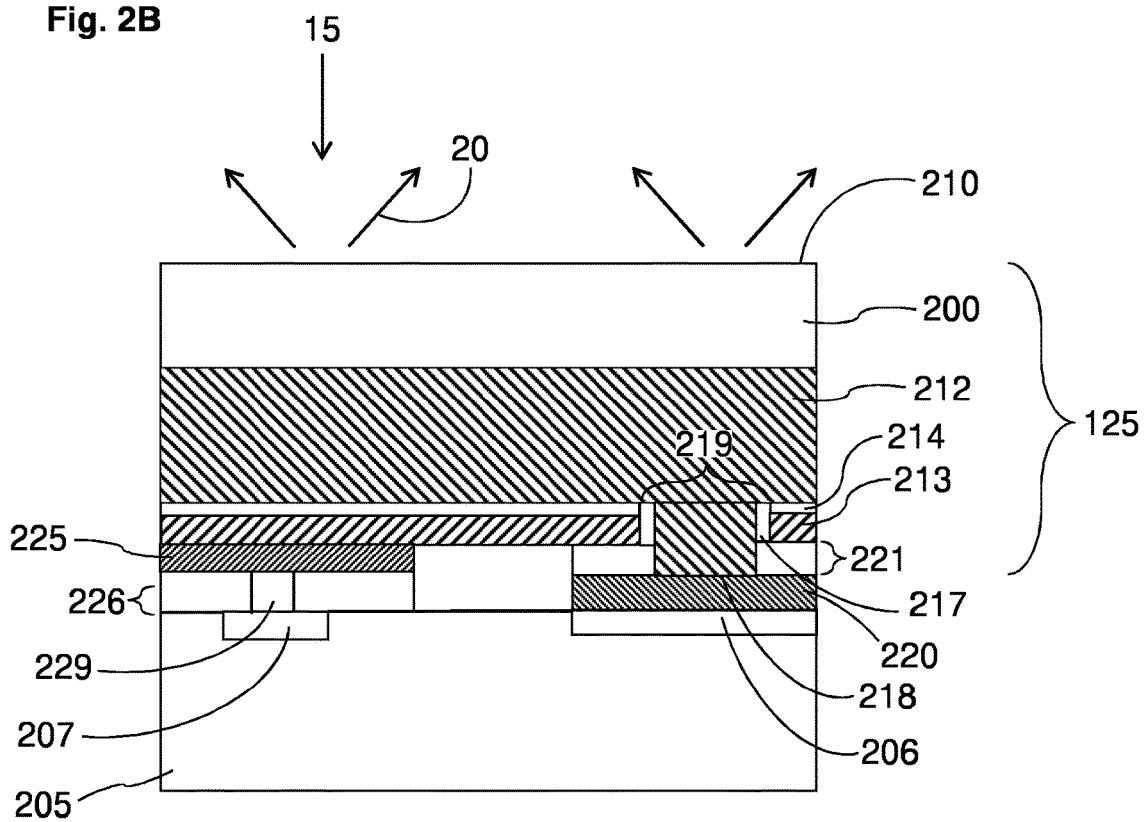
FIG. 2B illustrates a cross-sectional view through portions of an optoelectronic semiconductor device according to aspects in connection with a carrier element.

FIG. 2B illustrates a schematic cross-sectional view of a further aspect of a semiconductor device which may be designed as an optoelectronic semiconductor device 15. The optoelectronic semiconductor device 15 may include, for example, a transparent insulating substrate 200 which may be optional and may be omitted depending on the design. The substrate 200 may, for example, include a sapphire substrate. A first semiconductor layer 212, for example, of a first conductivity type, for example, n-type, may be arranged over the substrate 200. A second semiconductor layer 213, for example, of a second conductivity type, for example, p-type, may be arranged over the first semiconductor layer 212. For example, an active area 214 may be arranged between the first and second semiconductor layers 212, 213. The active area 214 may, for example, include a pn junction, a double heterostructure, a single quantum well (SQW) structure or a multi quantum well (MQW) structure for generating radiation. In this process, the term "quantum well structure" may include no meaning with regard to the dimensionality of the quantization. Thus, it may include, among other things, quantum wells, quantum wires and quantum dots, as well as any combination of these layers.

Electromagnetic radiation 20 emitted by the semiconductor device 15 may be output, for example, via a first main surface 210 of the substrate 200 or of the first semiconductor layer 212. The optoelectronic semiconductor device 20 may thus represents a flip-chip device within which contacts for contacting the semiconductor layers may be arranged on a side of the semiconductor stack that faces away from the light emission surface 210. Part of a metallic layer may be arranged adjacent to the second semiconductor layer 213 and may form a second contact pad 225. Part of a further metallic layer may be arranged over an insulating layer stack 221 and may be electro-conductively connected to the first semiconductor layer 212 via an electrical contact material 218. For example, the first contact pad 220 may be connected to the first semiconductor layer 212 via a contact element 218. The first contact element 218 may be arranged within a contact opening 219 and may be isolated from the second semiconductor layer 213 via a side wall insulation 217 and the first insulating layer stack 221.

The optoelectronic semiconductor device 15 may further include a carrier element 205, for example, a printed circuit board or a semiconductor chip with contact areas 207, 206 arranged therein.

A second insulating layer stack 226 may be arranged over an exposed surface of the second contact pad 225. The first and the second insulating layer stacks 221, 226 may each include an insulating layer 150, as discussed above, and the stress compensation layer stack 165 described above. The second insulating layer stack may also be omitted. When applying the semiconductor chip 125 to the carrier element 205 and subsequently heating it to carry out a connecting or soldering process, high temperatures may occur, which may lead to a thermal and mechanical stress on the optoelectronic semiconductor device 15. Due to the fact that the optoelectronic semiconductor device may include an insulating layer stack 221, 226 with the stress compensation layer stack 165 described, the thermal and mechanical stresses that occur may be efficiently compensated for. For example, the insulating layer 150 may be formed within the insulating layer stack 221 adjacent to the first contact pad 220. In a corresponding manner, the insulating layer 150, which may be in contact with the second contact pad 225, may be formed within the second insulating layer stack 226.

Figure 2C:
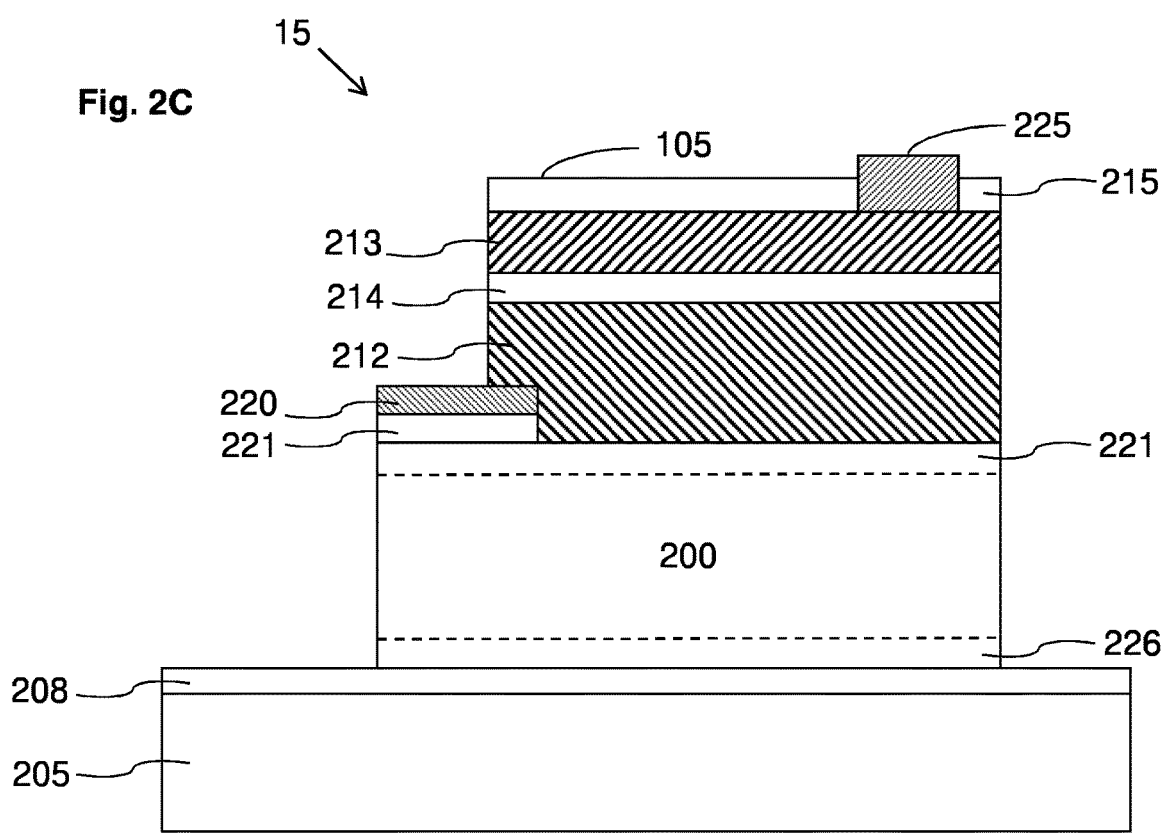
FIGS. 2C to 2E illustrate cross-sectional views of optoelectronic semiconductor devices according to further aspects.
Figure 2D:
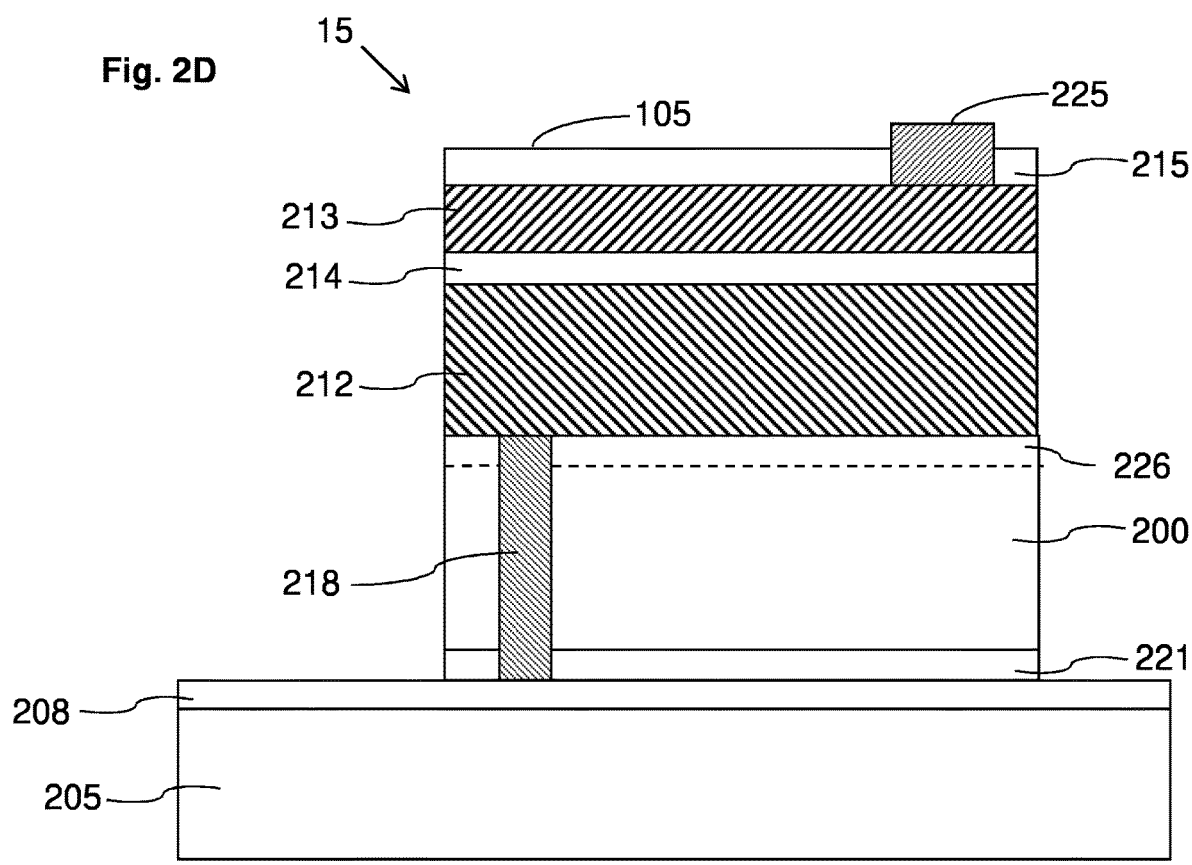
Figure 2E:
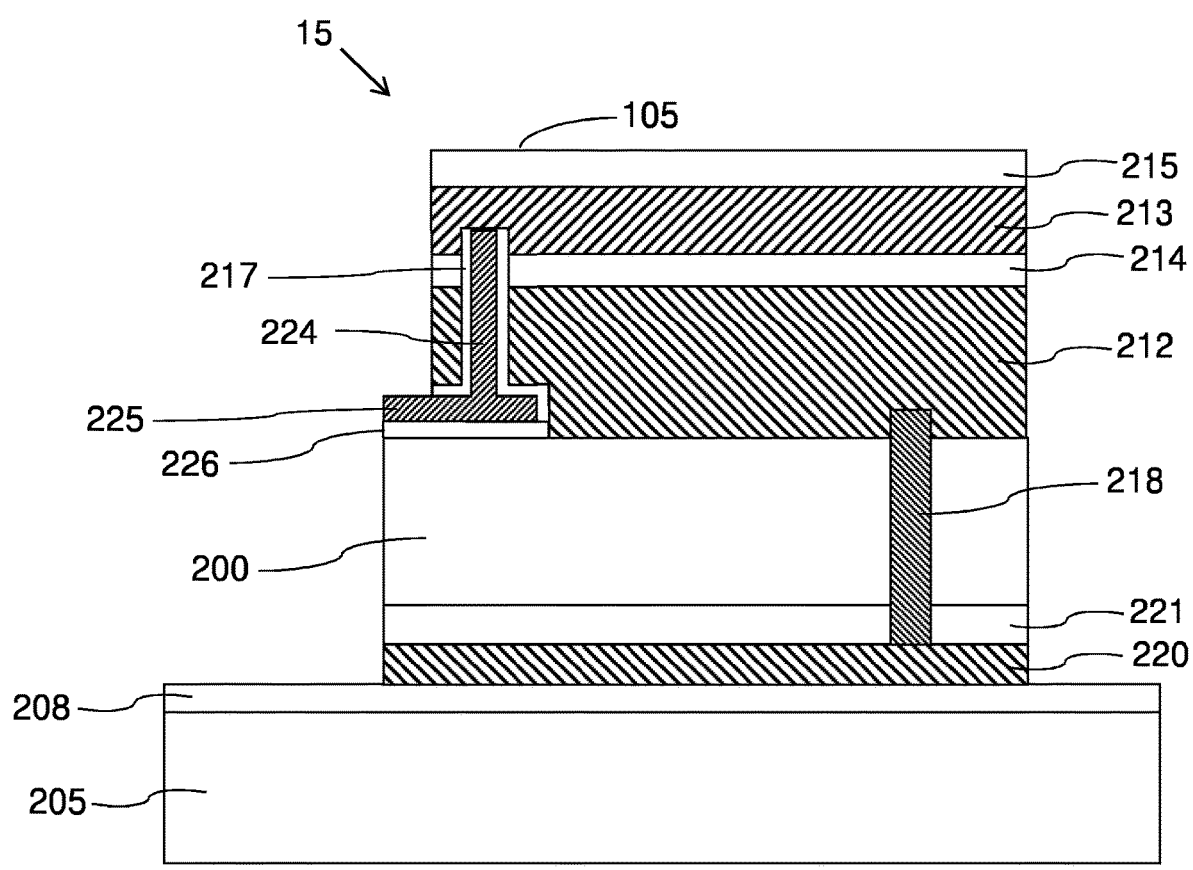

FIGS. 2C to 2E illustrate cross-sectional views through further examples of optoelectronic semiconductor devices 15, within each of which the substrate 200 may be arranged on a side of the optoelectronic semiconductor devices 15 that faces away from a light emission surface or light incidence surface. The light emission surface or light incidence surface may correspond to a first main surface 105 of the optoelectronic semiconductor device 15.

The optoelectronic semiconductor device illustrated in FIG. 2C may include a first semiconductor layer 212 of a first conductivity type, for example, n- or p-type, a second semiconductor layer 213 of a second conductivity type, for example, p- or n-type, and, if applicable, an active area 214 as described above. The active area 214 may be arranged between the first semiconductor layer 212 and the second semiconductor layer 213. A converter 215 may, for example, be arranged over the second semiconductor layer 213. A second contact pad 225 formed of electrically conductive material may be electro-conductively connected to the second semiconductor layer 213. For example, the second contact pad 225 may be arranged on a side of the second semiconductor layer 213 that faces away from the first semiconductor layer 212. The second contact pad may be arranged in the area of the first main surface 105 of the optoelectronic semiconductor device. A first contact pad 220 made of electrically conductive material may be electrically connected to the first semiconductor layer 212 and may be arranged on a side of the first semiconductor layer 212 that faces away from the second semiconductor layer 213. The layer stack of the first and second semiconductor layers may, for example, be arranged over a substrate 200, which, for example, may be constructed from an insulating material, a conductive material or a semiconductor material. The substrate 200 may, for example, be mounted on a carrier element 205. For example, one or more conductive lines 208 may be arranged within or over the carrier element 205. The conductive lines 208 may be made of an electrically conductive material.

According to aspects, a first insulating layer stack 221 may be arranged adjacent to the first contact pad 220. For example, it may be arranged between the first contact pad 220 and the substrate 200. For example, the first insulating layer stack 221 may approximately include a similar size to the first contact pad 220 and may not extend over the entire lateral extension of the substrate. According to further aspects, it may extend over the entire lateral extension of the substrate 200.

Furthermore, a second insulating layer stack 226 may be arranged between the substrate 200 and the carrier element 205. For example, the second insulating layer stack 226 may adjoin, at least in sections, the conductive line 226.

The first and the second insulating layer stacks 221, 226 may each include an insulating layer 150, as discussed above, and the stress compensation layer stack 165 described above.

FIG. 2D illustrates a schematic cross-sectional view of an optoelectronic semiconductor device 15 according to further aspects. Many components of the optoelectronic semiconductor device 15 illustrated in FIG. 2D may correspond to those illustrated in FIG. 2C. Deviating from FIG. 2C, the substrate 200 may be insulating. The conductive line 208 may be connected to the first semiconductor layer 212 via a contact element 218. A first insulation layer stack 221, as described above, may be arranged between the conductive line 208 and the substrate 200. A second insulating layer stack 226 may be arranged between the substrate 200 and the first semiconductor layer 212. The first and the second insulating layer stacks 221, 226 may each include an insulating layer 150, as discussed above, and the stress compensation layer stack 165 described above.

FIG. 2E illustrates a schematic cross-sectional view of an optoelectronic semiconductor device 15 according to further aspects. Many components of the optoelectronic semiconductor device 15 illustrated in FIG. 2E may correspond to those illustrated in FIGS. 2C and 2D. Deviating from FIG. 2C, the substrate 200 may be insulating. Furthermore, the second contact pad 225 may be arranged on one side of the first semiconductor layer 212. The contact pad 225 may be, for example, connected to the second semiconductor layer 213 by a contact element 224, which may extend through the first semiconductor layer 212 and the active area 214. The contact element 224 may be isolated from the first semiconductor layer 212 and the active area 214 by a sidewall insulation 217. The sidewall insulation 217 may, for example, be implemented by an insulating layer stack. For example, the first contact pad may be arranged on a side of the substrate 200 that faces away from the first semiconductor layer 212. Furthermore, a second insulating layer stack 226 may be arranged between the second contact pad 225 and the substrate 200. The first contact pad 220 may be connected to the first semiconductor layer 212 via a contact element 218. The contact element 218 may extend through the substrate 200. For example, the first contact pad 220 may adjoin the conductive line 208. According to aspects, a first insulating layer stack 221 may be arranged on a side of the substrate 200 which may be adjacent to the carrier element 205.

The first and the second insulating layer stacks 221, 226 and, if applicable, the insulating layer stack representing the sidewall insulation 217 may each include an insulating layer 150 as discussed above, as well as the stress compensation layer stack 165 described above.

FIG. 3A illustrates a schematic cross-sectional view of an optoelectronic device 15, which represents a flip-chip LED chip. A second main surface 302 of a transparent substrate 300 may be, for example, roughened in order to increase the light extraction efficiency of the optoelectronic semiconductor device. A first main surface 301 of the transparent substrate 300 may serve as a light emission surface of the optoelectronic semiconductor device. A second semiconductor layer 307, for example, of the second conductivity type, for example, n-type, may be arranged over the second main surface 302 of the substrate 300. A first semiconductor layer 305 of a first conductivity type, for example, p-type, may be arranged over the second semiconductor layer 307. An active area 308 may be arranged between the first and second semiconductor layers 305, 307. The first semiconductor layer 305 may be electrically connected to a first contact pad 312 via the mirror layer 310 and a first metal layer 311. The mirror layer 310 may, for example, include silver. The first metal layer 311 may be formed from a common metal for contacting the first semiconductor layer 305; examples may include Au, Ti, Pt or Ni. A material of the first contact pad 312 may, for example, include Ti, Cr, Al, Mo, Ni, W, AuSn, Sn, Cu and Pt.

The second semiconductor layer 307 may be connected to a second contact pad 321 via a second metal layer 320. The second metal layer 320 may be arranged within a contact opening 319 formed within the first semiconductor layer 305. An electrically insulating material may be arranged between the second metal layer 320 and the mirror layer 310, as well as the first metal layer 311. For example, the insulating material may include an insulating layer 316 and a stress compensation layer stack 318. For example, the insulating layer 316 may be structured analogously to the insulating layer 150. The insulating layer 316 may adjoin both the first and the second main surfaces of the second metal layer 320. According to aspects, however, the insulating layer 316 may also be arranged on only one side of the second metal layer 320. In addition, the stress compensation layer stack 318 may adjoin the insulating layer 316. The stress compensation layer stack 318 may be formed similarly to that discussed with reference to FIGS. 1A to 1D.

According to further aspects, a further insulating layer 314 may be arranged between the first metal layer and the stress compensation layer stack 318. For example, the further insulating layer 314 may be constructed from $Al_2O_3$. Parts of the insulating layer 314 may also be formed adjacent to the first metal layer 311 at further sites.

Due to the fact that the insulating material, which may isolate the p-contact from the n-contact, may include the stress compensation layer stack 318, a thermal and mechanical stress that, for example, may occur if the optoelectronic semiconductor device 15 is applied to a suitable carrier element, and may be effectively compensated for. As a result, the metal layer may be reliably isolated and protected, and the reliability of the optoelectronic semiconductor device may be increased.

Figure 3B:
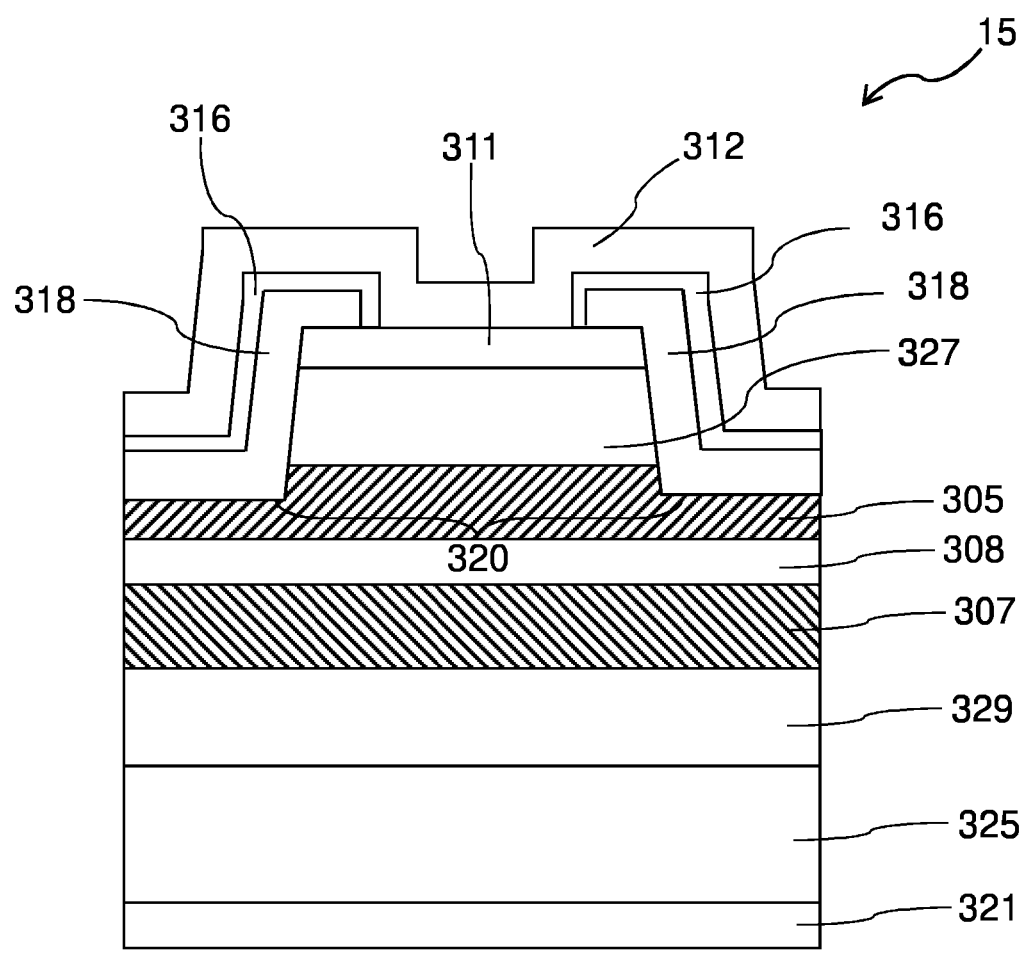
FIG. 3B illustrates a cross-sectional view through portions of an optoelectronic semiconductor device according to further aspects.

FIG. 3B illustrates an optoelectronic semiconductor device 15 according to further aspects. The optoelectronic semiconductor device 15 may be implemented, for example, as a semiconductor laser. The semiconductor laser may include, for example, a first semiconductor layer 305 of a first conductivity type, for example, p-type, and a second semiconductor layer 307 of a second conductivity type, for example, n-type. An active area 308 may be arranged between the first and second semiconductor layers 305, 307. The first and the second semiconductor layers 305, 307 may each act as waveguide layers. In addition, a suitable first cladding layer 327 of the first conductivity type may be arranged adjacent to the first semiconductor layer 305. Furthermore, a second cladding layer 329 of a second conductivity type may be arranged adjacent to the second semiconductor layer 307. The second cladding layer 329 may be arranged over a substrate 325. The substrate 325 may, for example, include a semiconductor substrate, for example, made of GaN. Furthermore, a conductive layer 321, which may form a second contact pad, may be arranged adjacent to one side of the substrate 325. Furthermore, a suitable first metal layer 311 may be arranged as a contact layer to the cladding layer 327. A first contact pad 312 may be arranged adjacent to the first metal layer.

The semiconductor layer sequence may include, for example, a conventional pn junction, a double heterostructure, a single quantum well structure (SQW structures) or a multi quantum well structure (MQW structures) as the active area. In addition to the active area, the semiconductor layer sequence may include further functional layers and functional areas such as p- or n-doped charge carrier transport layers, p- or n-doped confinement, cladding or waveguide layers, barrier layers, planarization layers, buffer layers, protective layers and/or electrodes and combinations thereof. The electrodes may each include one or more metal layers with Ag, Au, Sn, Ti, Pt, Pd, Rh and/or Ni. Such structures, relating to the active area or the further functional layers and areas, may be known to a person skilled in the art, in particular, with regard to the composition, function and structure and are therefore not explained in more detail at this point.

In addition, additional layers such as buffer layers, barrier layers and/or protective layers may also be arranged perpendicular to the direction of growth of the semiconductor layer sequence, for example, around the semiconductor layer sequence, that is to say on the side faces of the semiconductor layer sequence.

The stack of the first semiconductor layer 305, the first cladding layer 327 and the first metal layer 311 may be structured to form a ridge 30. More precisely, the ridge 30 may be formed along a direction of propagation of the generated laser radiation in the horizontal direction. In particular, such a configuration of the semiconductor layer sequence, also referred to as a "ridge structure", may be suitable, depending on its width and height and due to the ridge-shaped structure and an associated jump in the refractive index, a so-called indexing, for enabling the generation of a transverse fundamental mode in the active area. The ridge may, in particular, extend from the radiation outcoupling surface to the side face of the semiconductor layer sequence opposite the radiation outcoupling surface. The radiation outcoupling surface may run parallel to the cross section illustrated.

According to aspects, an insulating material may be arranged between the first contact pad 312 and the semiconductor layers of the semiconductor laser. For example, the insulating material may include an insulating layer 316 and a stress compensation layer stack 318, which may be formed as discussed with reference to FIGS. 1A to 1D. The presence of the stress compensation layer stack 318 between the first contact pad 312 and the semiconductor material may effectively compensate for thermal and mechanical stress, such as occurs, for example, when the first contact pad 312 is soldered onto a suitable carrier element.

In the semiconductor device illustrated, an effect may additionally occur that the effective refractive index of the adjacent semiconductor material may be modified by the stress compensation layer stack due to the photoelastic effect. For example, an anti-guiding effect caused by stress may be compensated for. As a result, the indexing of the laser mode in the semiconductor laser may be improved.

Figure 4A:
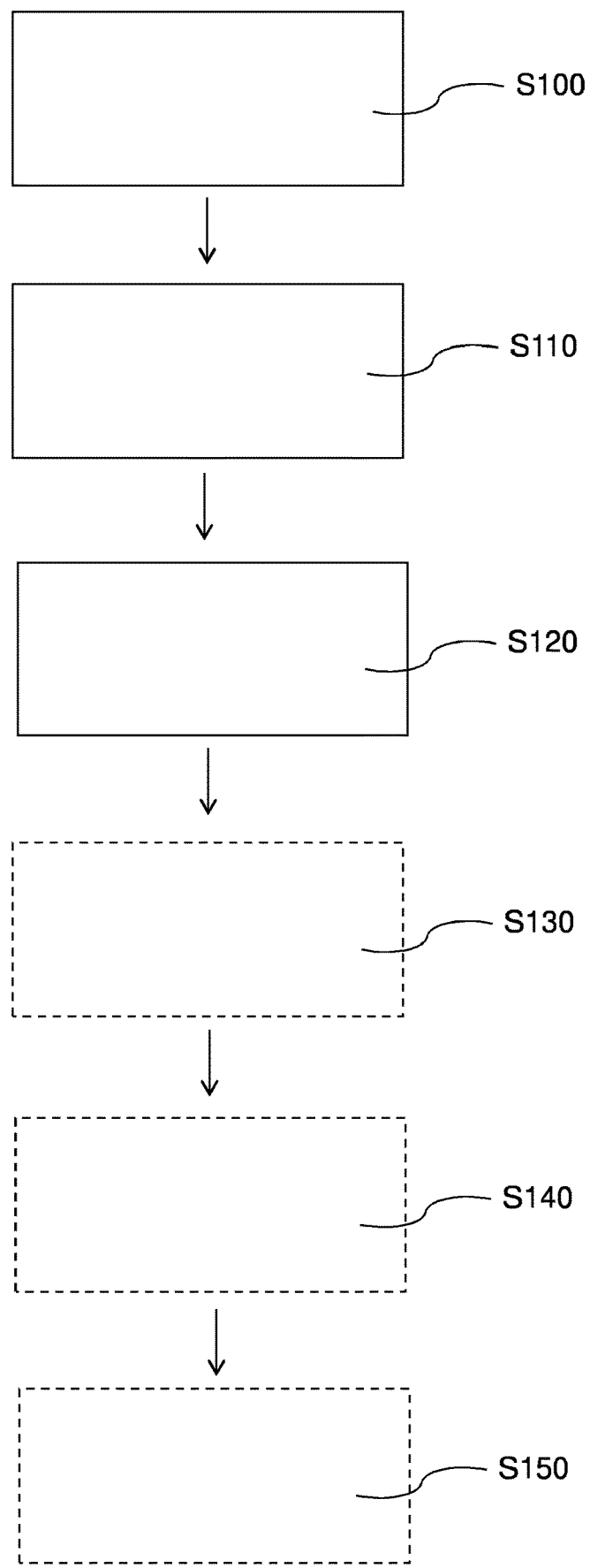
FIG. 4A illustrates a flowchart of a method according to aspects.

FIG. 4A illustrates a flowchart of a method according to aspects

A method for manufacturing a semiconductor device may include forming (S100) a conductive layer over a semiconductor body, forming (S110) an insulating layer adjacent to the conductive layer, and forming (S120) a first stress compensation layer, which may include a defined first stress, adjacent to the insulating layer.

According to further aspects, the method may further include forming (S130) a first stress-relieving layer adjacent to the first stress compensation layer. The method may, in addition, include forming (S140) a second stress compensation layer with a defined second stress adjacent to the first stress-relieving layer. The method may further include forming (S150) a second stress-relief layer adjacent to the second stress compensation layer. For example, the defined first stress may include a tensile stress. The defined second stress may include a compressive stress. An absolute value of the stress in the first and second stress-relieving layers may, in each case, be less than a predetermined limit value.

Figure 4B:
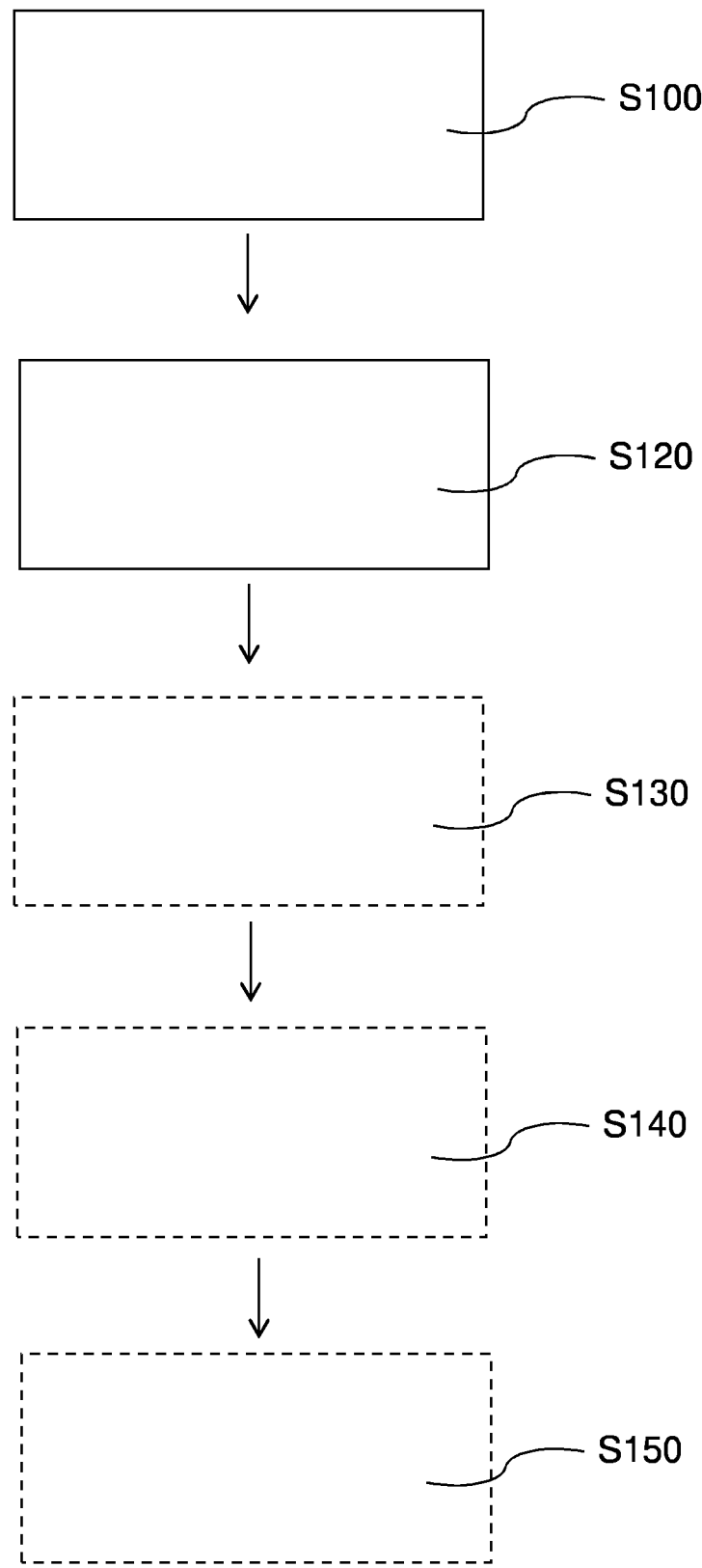
FIG. 4B illustrates a flowchart of a method according to further aspects.

FIG. 4B illustrates a flowchart of a method according to aspects.

A method for manufacturing a semiconductor device may include forming (S100) a conductive layer over a semiconductor body and forming (S120) a first stress compensation layer, which may include a defined first stress, adjacent to the conductive layer.

According to further aspects, the method may further include forming (S130) a first stress-relieving layer adjacent to the first stress compensation layer. The method may, in addition, include forming (S140) a second stress compensation layer with a defined second stress adjacent to the first stress-relieving layer. The method may further include forming (S150) a second stress-relief layer adjacent to the second stress compensation layer. For example, the defined first stress may include a tensile stress. The defined second stress may include a compressive stress. An absolute value of the stress in the first and second stress-relieving layers may, in each case, be less than a predetermined limit value.

In the described method, the sequence for forming the conductive layer, the insulating layer and the first stress compensation layer may, according to aspects, vary depending on the structure of the layer as long as the layers formed adjoin the corresponding layers. For example, the first stress compensation layer may initially be formed over a semiconductor body. Subsequently, the insulating layer may be formed adjacent to the first stress compensation layer, and the conductive layer may be formed adjacent to the insulating layer. The effect described may be, for example, not tied to a specific sequence of the deposition processes but to adjacent layers within the layer stack produced.

In a corresponding manner, the sequence of the further process may be given as an example and may be arbitrary.

For example, the stress compensation layers and stress-relieving layers may be constructed from silicon oxide. According to aspects, they may be formed with a PECVD method using TEOS as the starting material.

According to aspects, the type of stress in the first stress compensation layer, i.e. whether compressive stress or tensile stress, may be selected depending on the type of stress in the adjacent conductive or insulating layer. For example, it may be selected in such a manner that the type of stress corresponds to the type of stress in the adjacent conductive or insulating layer.

For example, the stress in the stress compensation layers and the stress-relieving layers may be set by setting the deposition parameters. For example, a compressive stress may be created by increasing the RF power and the pressure during the deposition. A tensile stress may be created by decreasing the pressure during the deposition and decreasing the RF power. In particular, when using a PECVD process for deposition, a stable stress may be achieved due to the high temperature that is present in this process (approx. 300° C.)

Although specific aspects are been illustrated and described herein, persons skilled in the art will recognize that the specific aspects illustrated and described may be replaced by a multitude of alternative and/or equivalent aspects without departing from the scope of the invention. Aspects may cover any adaptations or variations of the specific aspects discussed herein. Therefore, the aspects may be limited only by the claims and their equivalents.

LIST OF REFERENCES

10 Semiconductor device
15 Optoelectronic semiconductor device
20 Electromagnetic radiation
100 Semiconductor body
105 First main surface of the optoelectronic semiconductor device
110 First main surface of the semiconductor body
120 Second main surface of the semiconductor body
125 Semiconductor chip
130 Conductive layer
140 First main surface of the conductive layer
150 Insulating layer
155 Passivation layer stack
160 First main surface of the insulating layer
165 Stress compensation layer stack
170 First stress compensation layer
175 Second stress compensation layer
177 Third stress compensation layer
180 First stress-relieving layer
185 Second stress-relieving layer
187 Third stress-relieving layer
200 Substrate
205 Carrier element
206 First contact area
207 Second contact area
208 Conductive line
210 First main surface of the optoelectronic semiconductor device
212 First semiconductor layer
213 Second semiconductor layer
214 Active area
215 Converter
217 Sidewall insulation
218 Contact element
219 Contact opening
220 First contact pad
221 First insulating layer stack
224 Contact element
225 Second contact pad
226 Second insulating layer stack
228 Contact material
229 Contact material
230 Semiconductor substrate
232 First component of the semiconductor device
234 Second component of the semiconductor device
300 Substrate
301 First main surface of the substrate
302 Second main surface of the substrate
305 First semiconductor layer
307 Second semiconductor layer
308 Active area
310 Mirror layer
311 First metal layer
312 First contact pad
314 Insulating layer
316 Insulating layer
318 Stress compensation layer stack
319 Contact opening
320 Second metal layer
321 Second contact pad
325 Laser substrate
327 First cladding layer
329 Second cladding layer
330 Ridge

The invention claimed is:

1. A semiconductor device, comprising:
a metal layer over a semiconductor body,
a first stress compensation layer which has a defined first stress,
a second stress compensation layer which has a defined second stress,
the first stress compensation layer being directly adjacent to the metal layer, the second stress compensation layer being arranged on a side of the first stress compensation layer that faces away from the metal layer, wherein the first stress compensation layer has the same kind of stress as the metal layer, and
a first stress-relieving layer between the first and the second stress compensation layers, in which an absolute value of stress of the first stress-relieving layer is less than the absolute value of the first stress and less than the absolute value of the second stress.

2. The semiconductor device according to claim 1, wherein the first stress compensation layer contains silicon oxide.

3. The semiconductor device according to claim 1, wherein the first stress is a compressive stress.

4. The semiconductor device according to claim 1, further comprising a third stress compensation layer having a defined third stress, which is arranged on a side of the second stress compensation layer that faces away from the metal layer.

5. The semiconductor device according to claim 1, wherein the first stress is a tensile stress.

6. The semiconductor device according to claim 5, wherein the second stress is a compressive stress.

7. The semiconductor device according to claim 5, wherein the second stress is a tensile stress.

8. The semiconductor device according to claim 4, wherein the third stress is a compressive stress.

9. The semiconductor device according to claim 1, further comprising a third stress compensation layer having a defined third stress, which is arranged on a side of the second stress compensation layer that faces away from the metal layer, and a second stress-relieving layer between the second and third stress compensation layers, in which an absolute value of the stress of the second stress-relieving layer is less than the predetermined limit value.

10. An optoelectronic semiconductor device, comprising:
a semiconductor body comprising a first semiconductor layer of a first conductivity type and a second semiconductor layer of a second conductivity type,
a conductive layer over the semiconductor body, the conductive layer being electrically connected to the first or second semiconductor layer,
an insulating layer directly adjacent to the conductive layer,
a first stress compensation layer directly adjacent to the insulating layer, which has a defined first stress;
a second stress compensation layer having a defined second stress, which is arranged on a side of the first stress compensation layer that faces away from the conductive layer, wherein the first and second stress compensation layers are part of a passivation layer stack, a first stress-relieving layer between the first and the second stress compensation layers, in which an absolute value of stress of the first stress-relieving layer is less than the absolute value of the first stress and less than the absolute value of the second stress.

11. The semiconductor device according to claim 10, wherein the first stress is adapted to a stress in a layer lying between the first stress compensation layer and the semiconductor body.

12. The semiconductor device according to claim 10, wherein the first stress is a compressive stress.

* * * * *